United States Patent
Adachi et al.

(10) Patent No.: US 6,891,243 B2
(45) Date of Patent: May 10, 2005

(54) SOLID-STATE IMAGE PICK-UP DEVICE

(75) Inventors: Yuko Adachi, Miyagi (JP); Tetsuo Yamada, Miyagi (JP); Shinji Uya, Miyagi (JP)

(73) Assignee: Fugi Photo Film Co., Ltd., Ashigara (JP)

( * ) Notice: Subject to any disclaimer, the term of this patent is extended or adjusted under 35 U.S.C. 154(b) by 0 days.

(21) Appl. No.: 10/615,904

(22) Filed: Jul. 10, 2003

(65) Prior Publication Data
US 2004/0007754 A1 Jan. 15, 2004

(30) Foreign Application Priority Data
Jul. 10, 2002 (JP) ..................................... P. 2002-201501

(51) Int. Cl.[7] .............................................. H01L 31/00
(52) U.S. Cl. ...................... 257/443; 252/444; 252/445; 252/446; 252/459; 252/460; 252/461; 252/462
(58) Field of Search ................................ 257/447, 444, 257/445, 459, 460, 461, 462, 228, 291, 232, 223

(56) References Cited

U.S. PATENT DOCUMENTS

| | | | | |
|---|---|---|---|---|
| 4,518,978 A | * | 5/1985 | Takeshita | .................... 257/232 |
| 4,688,098 A | * | 8/1987 | Kon et al. | ................... 348/299 |
| 4,740,824 A | * | 4/1988 | Yano et al. | .................. 257/444 |
| 5,286,988 A | * | 2/1994 | Nishi | .......................... 257/223 |
| 5,744,831 A | * | 4/1998 | Tanaka | ........................ 257/225 |
| 6,635,911 B2 | * | 10/2003 | Maruyama | ................... 257/291 |
| 2001/0054723 A1 | * | 12/2001 | Narui et al. | ................ 257/228 |

FOREIGN PATENT DOCUMENTS

JP       2002-57381 A      2/2002

* cited by examiner

Primary Examiner—Nathan J. Flynn
Assistant Examiner—Fazli Erdem
(74) Attorney, Agent, or Firm—Birch Stewart Kolasch & Birch, LLP

(57) ABSTRACT

In a solid-state image pick-up device comprising a plurality of light receiving sensor sections, a vertical transfer path 12 formed close to each of the light receiving sensor sections, and a channel stopper 13 provided between the adjacent vertical transfer paths 12 and formed by an insulating layer having a trench structure, a conductive substance 15 to which a predetermined voltage is applied is buried in the insulating layer 14. The predetermined voltage is a negative voltage if a signal charge is an electron, and is a positive voltage if the signal charge is a hole. Alternatively, the predetermined voltage is a pulse having an opposite phase to that of a read pulse to be applied to a transfer electrode 17 of the vertical transfer path 12.

12 Claims, 11 Drawing Sheets

SOLID-STATE IMAGE PICK-UP DEVICE

BACKGROUND OF THE INVENTION

1. Field of the Invention

The present invention relates to a solid-state image pick-up device such as a CCD, and more particularly to a solid-state image pick-up device including a channel stopper having a trench structure for isolating adjacent elements.

2. Description of the Related Art

FIG. 10 is a sectional view showing the main part of a conventional solid-state image pick-up device. A vertical transfer path (VCCD) 1 in an n region is formed in the surface portion of the semiconductor substrate of the solid-state image pick-up device, and an isolation is carried out between the adjacent vertical transfer paths 1 through a channel stopper (CS) 2 constituted by a p-type impurity layer. Moreover, a transfer and read electrode 3 comprising a polycrystalline silicon is provided on the surface of the semiconductor substrate.

The p-type impurity of the channel stopper 2 is diffused to the adjacent vertical transfer path 1 so that the effective transfer path (channel) width of the vertical transfer path 1 is decreased, resulting in a reduction in the channel potential of the vertical transfer path 1. This influence becomes more remarkable in manufacture in which the width of the vertical transfer path 1 is more reduced, which is referred to as a narrow channel effect.

FIG. 11 is a graph showing the narrow channel effect. For example, when the vertical transfer path 1 has a channel width of 0.5 μm, a potential of 5.8V is applied in a vertical transfer path in which a channel stopper (CS) is not provided. If the channel stopper is provided on either side, a potential of 5.3V is applied. If the channel stopper is provided on both sides, a potential of 4.6V is applied. Consequently, a charge is insufficiently read from a photodiode (pixel) to the vertical transfer path 1 or is insufficiently transferred along the vertical transfer path 1.

FIG. 12 is a chart in which a potential gradient around the channel stopper 2 shown in FIG. 10 is simulated, and the channel stopper 2 is formed around a position of 0.75 μm on an X coordinate. FIG. 12 is a chart showing a two-dimensional potential gradient obtained when a voltage of 0V is applied to the electrode 3 in FIG. 10, and FIG. 13 is a chart showing a two-dimensional potential gradient obtained when a voltage of –8V is applied to the electrode 3. Moreover, FIGS. 14 and 15 are charts showing a two-dimensional potential gradient and a one-dimensional potential which are obtained when a read voltage of +16V is applied to the electrode 3, and FIG. 16 is a chart showing a one-dimensional potential obtained when a charge is stored in the vertical transfer path.

From these drawings, it is apparent that the effect of an isolation obtained by the channel stopper 2 is small in the solid-state image pick-up device shown in FIG. 10. As shown in FIGS. 14 and 15, particularly, the potential of the channel stopper 2 also becomes deep by the influence of the potential of the transfer path, and a potential difference between the transfer path 1 and the channel stopper 2 is reduced and an isolation effect is small.

FIG. 17 is a view showing the structure of a conventional solid-state image pick-up device (for example, JP-A-2002-57381) in which an oxide film 4 is buried in the channel stopper 2 as compared with the solid-state image pick-up device shown in FIG. 10. FIGS. 18, 19 and 20 are views in which two-dimensional potential gradients obtained by application of voltages of 0V, –8V (transfer voltage) and +16V (read voltage) to the electrode 3 of the solid-state image pick-up device are simulated. Moreover, FIG. 21 is a chart showing a one-dimensional potential obtained when +16V is applied to the electrode 3 and FIG. 22 is a chart showing a one-dimensional potential obtained when a charge is stored in the vertical transfer path. The channel stopper 2 is formed to have a depth of 0.4 μm around a position of 0.75 μm on the X coordinate.

In the solid-state image pick-up device shown in FIG. 17, a channel potential is 11.5V in the application of 0V and is 4.1V in the application of –8V as shown in FIGS. 18 and 19 so that a degree of modulation (potential difference/voltage difference)=0.93 is obtained. On the other hand, in the solid-state image pick-up device shown in FIG. 10, a channel potential is 10.1V in the application of 0V and is 4.2V in the application of –8V as shown in FIGS. 12 and 13 so that a degree of modulation=0.74 is obtained. More specifically, it can be guessed that an oxide film 4 is buried in the channel stopper 2 so that the p-type impurity layer is eliminated, resulting in the prevention of a reduction in a channel potential and a relaxation in the influence of the narrow channel effect.

In the conventional solid-state image pick-up device shown in FIG. 17, however, in the case in which a charge is stored in the vertical transfer path 1, there is a problem in that a potential difference between an interface 5 of the channel stopper 2 and the signal charge of the vertical transfer path 1 is reduced (see FIGS. 16 and 22) and a charge (an electron in the solid-state image pick-up device shown in the drawing) is apt to be trapped into the interface 5. When the charge is trapped into the interface 5, the trapped charge gets into the vertical transfer path 1 of a next packet at a constant probability, thereby deteriorating a transfer efficiency.

In a recent solid-state image pick-up device mounting several million pixels, a transfer is carried out in one thousand stages or more through a one-time transfer along a vertical transfer path. For this reason, if one electron gets into an empty packet every transfer in one stage, for example, at least one thousand electrons get into the empty packet when the same packet is read from the vertical transfer path. Consequently, the picture quality of a pick-up image is considerably deteriorated.

Furthermore, the interface 5 is depleted. Therefore, there is also a problem in that the generation of a dark current from a dangling bond and the generation of a white scratch from a high-speed GR center (a heavy metal atom) are increased remarkably.

SUMMARY OF THE INVENTION

It is an object of the invention to provide a solid-state image pick-up device which relieves a narrow channel effect produced by a channel stopper and reduces the influence of a trapped charge and the influence of a dangling bond or a high-speed GR center.

In order to achieve the object, a solid-state image pick-up device comprises, on a semiconductor substrate, a plurality of light receiving sensor sections, a vertical transfer path formed close to each of the light receiving sensor sections, and a channel stopper provided between the adjacent vertical transfer paths and formed by an insulating layer having a trench structure, wherein a conductive substance to which a predetermined voltage is applied is buried in the insulating layer.

By this structure, a potential difference is made between the channel stopper (isolation region) and the vertical transfer path, and a charge mixture can be inhibited between the adjacent vertical transfer paths and a charge trap can also be prevented so that a narrow channel effect can be relieved.

It is suitable that a negative voltage should be applied as the predetermined voltage to bring an interface into a hole accumulation state when a signal charge is an electron, and a positive voltage should be applied as the predetermined voltage to bring the interface into an electron accumulation state when the signal charge is a hole. By this structure, it is possible to prevent a charge mixture, a deterioration in a transfer efficiency, an increase in a dark current and an increase in a white scratch by a simple voltage control.

It is suitable that the predetermined voltage should be a pulse having an opposite phase to that of a read pulse to be applied to a transfer electrode of the vertical transfer path. By this structure, a necessary voltage for a reading operation can be reduced.

In the foregoing, it is more suitable that a diffusion region having an opposite conductivity type to that of the light receiving sensor section should be formed in a lowermost part of the channel stopper. By this structure, the isolation effect of the channel stopper can be enhanced and a signal charge mixture between pixels can be prevented still more.

In the foregoing, it is more suitable that the conductive substance should also be doped with a doped impurity in the diffusion region, and the conductive substance and the diffusion region should be thus set in a connecting state. By this structure, it is possible to smoothly sweep a charge having an opposite polarity to that of a signal charge by utilizing the channel stopper.

In the foregoing, it is more suitable that the conductive substance should be a polycrystalline silicon. By this structure, a difference in a coefficient of thermal expansion between the semiconductor substrate of the solid-state image pick-up device and the conductive substance is eliminated so that it is possible to reduce a crystal defect generated by a stress on the side surface of a trench.

DESCRIPTION OF THE PREFERRED EMBODIMENTS

An embodiment of the invention will be described below with reference to the drawings.

Figure 1:
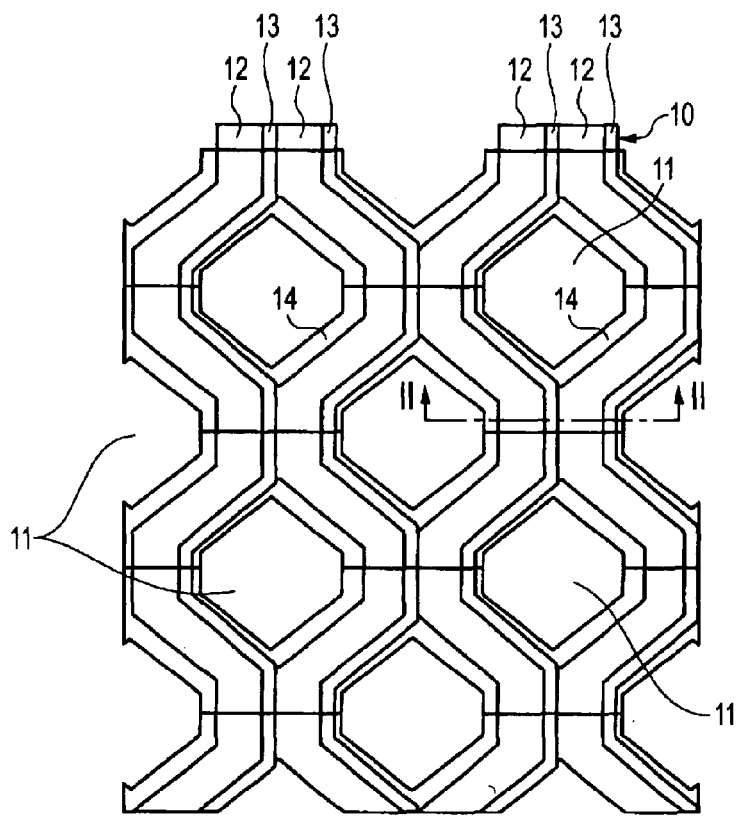
FIG. 1 is a plan view showing the main part of a solid-state image pick-up device according to a first embodiment of the invention.

FIG. 1 is a plan view showing the main part of a solid-state image pick-up device according to a first embodiment of the invention. A solid-state image pick-up device 10 is of a so-called honeycomb type in which a pixel 11 comprising a photodiode is formed with a shift of a 1/2 pitch every other line in a horizontal direction. Each pixel 11 has a vertical transfer path 12 formed zigzag at both sides thereof, and a channel stopper 13 is provided on the right side of each vertical transfer path 12. Consequently, the vertical transfer path 12 is isolated from an adjacent element in portions other than a necessary region 14 for reading a charge from the pixel 11. While the embodiment is intended for the solid-state image pick-up device of the honeycomb type, the invention can also be applied to a solid-state image pick-up device of a Bayer type having a channel stopper.

Figure 2:
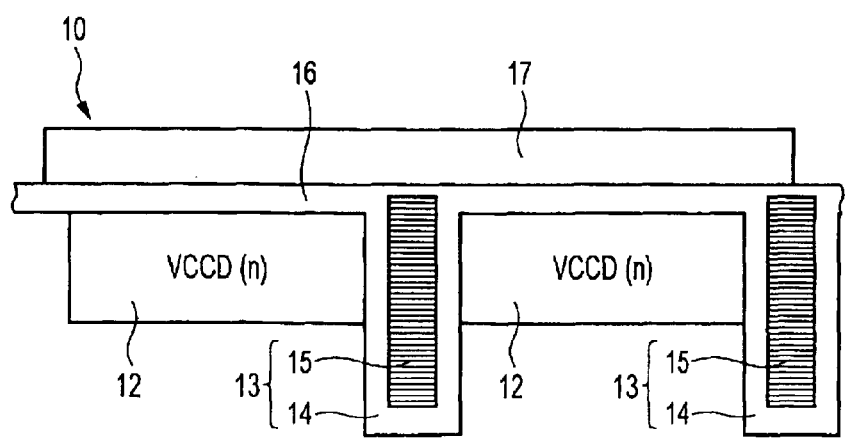
FIG. 2 is a sectional view taken along a line II—II in FIG. 1.

FIG. 2 is a sectional view taken along a line II—II in FIG. 1. The vertical transfer path 12 doped with an n-type impurity is provided in the surface portion of a semiconductor (silicon in this example) substrate of the solid-state image pick-up device 10, and the channel stopper 13 is provided between the adjacent vertical transfer paths 12. The channel stopper 13 is manufactured by providing a trench having a depth of 0.4 μm between the vertical transfer paths 12, oxidizing the surface of the semiconductor substrate to form the oxide film 14 and burying a polycrystalline silicon 15 in the trench. A transfer and read electrode 17 comprising a polycrystalline silicon is formed on the surface of the vertical transfer path 12 through a surface oxide film 16.

The polycrystalline silicon 15 buried in the channel stopper 13 is continuously formed over the full length of the vertical transfer path 12 along the vertical transfer path 12. When a predetermined voltage is applied to a connecting pad provided on the semiconductor substrate which is not shown, the polycrystalline silicon 15 is set to have a predetermined voltage over a full length after a predetermined time in accordance with a time constant determined by the resistance value of the polycrystalline silicon 15. In the embodiment, a negative voltage is always applied to the polycrystalline silicon 15.

Figure 3:
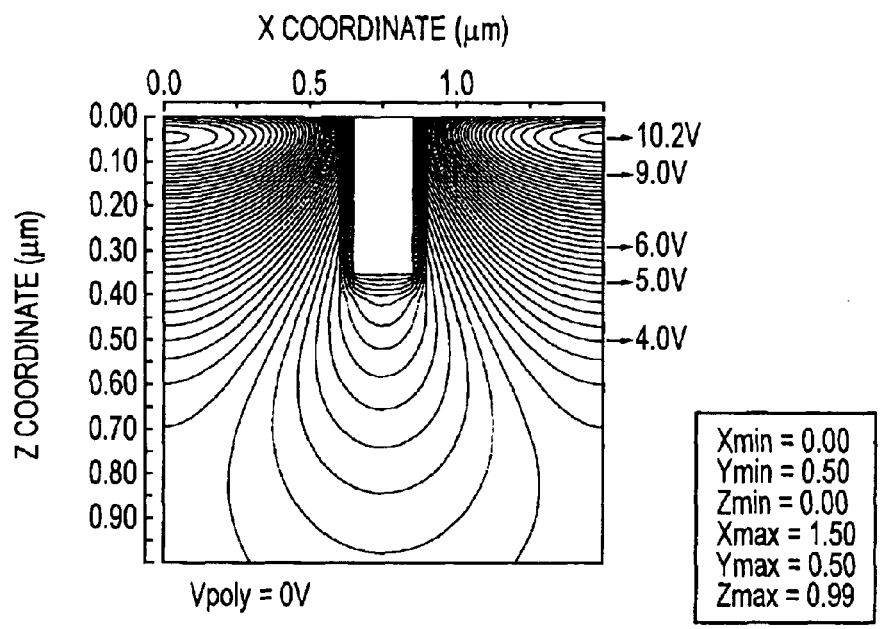
FIG. 3 is a chart showing a two-dimensional potential gradient around a channel stopper which is obtained when 0V is applied to an electrode illustrated in FIG. 2.

FIG. 3 is a chart in which a potential gradient around the channel stopper 13 shown in FIG. 1 is simulated. The channel stopper 13 is formed to have a depth of 0.4 μm around a position of 0.75 μm on an X coordinate and 0V is applied to the electrode 17 and the polycrystalline silicon 15.

Figure 4:
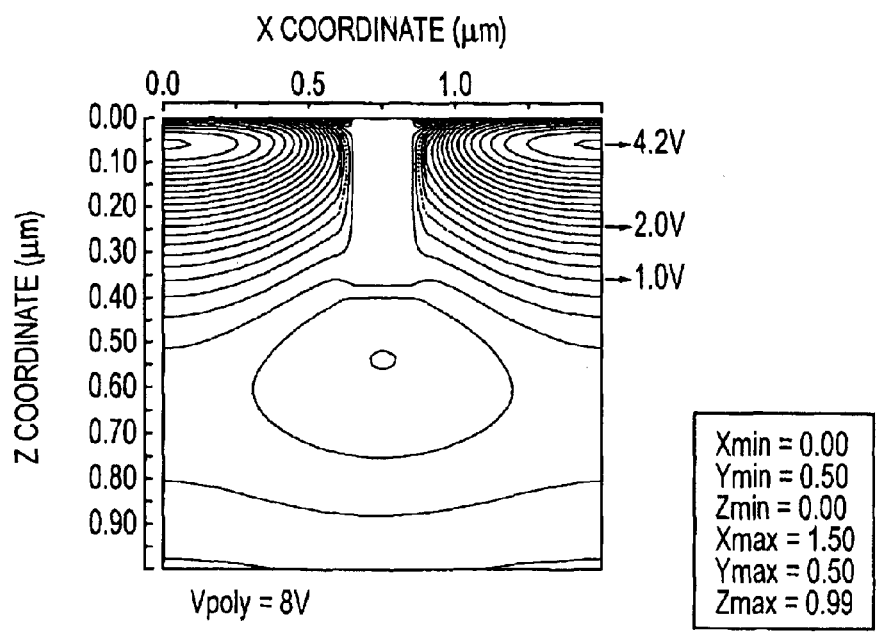
FIG. 4 is a chart showing a two-dimensional potential gradient around the channel stopper which is obtained when −8V is applied to the electrode illustrated in FIG. 2.
Figure 5:
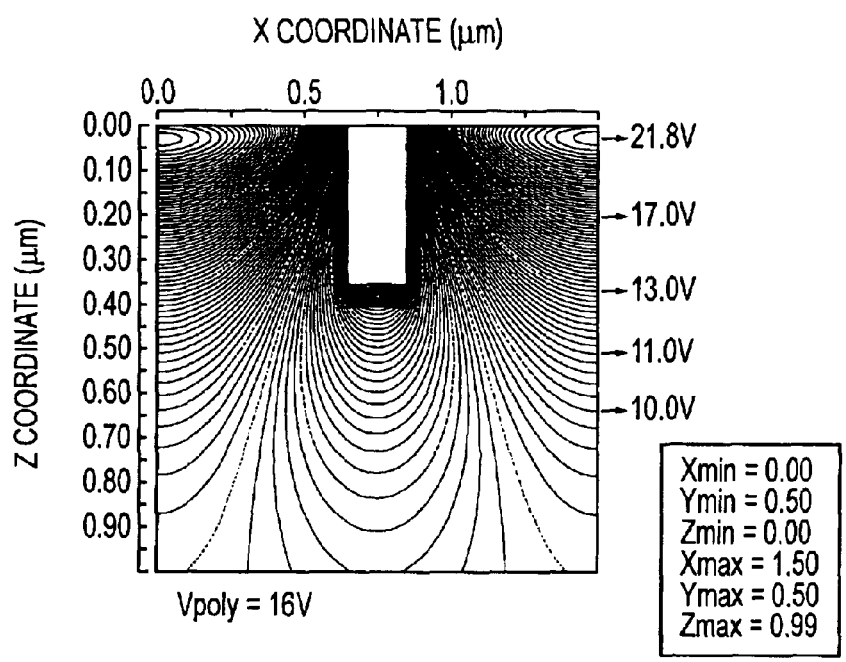
FIG. 5 is a chart showing a two-dimensional potential gradient around the channel stopper which is obtained when +16V is applied to the electrode illustrated in FIG. 2.
Figure 6:
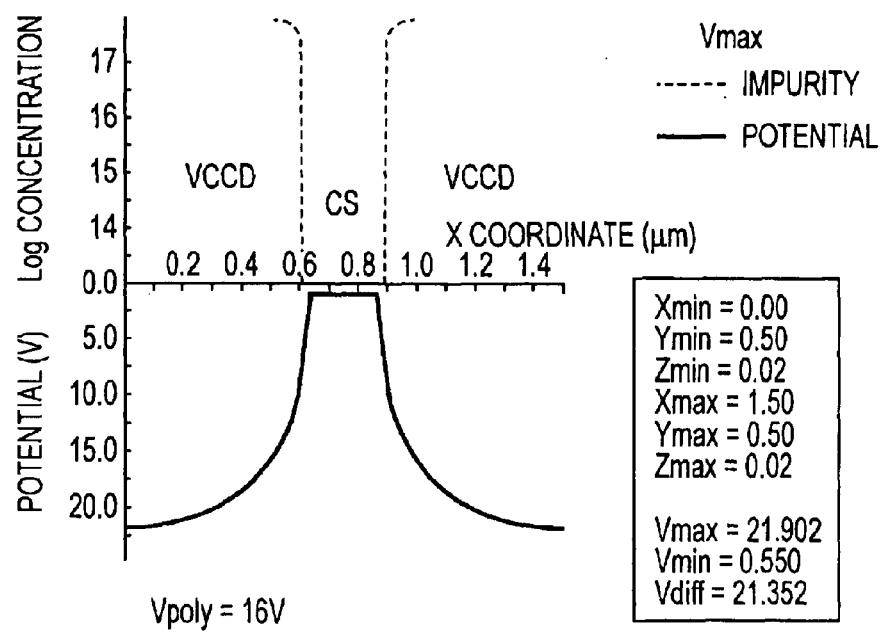
FIG. 6 is a chart showing a one-dimensional potential around the channel stopper which is obtained when +16V is applied to the electrode illustrated in FIG. 2.
Figure 7:
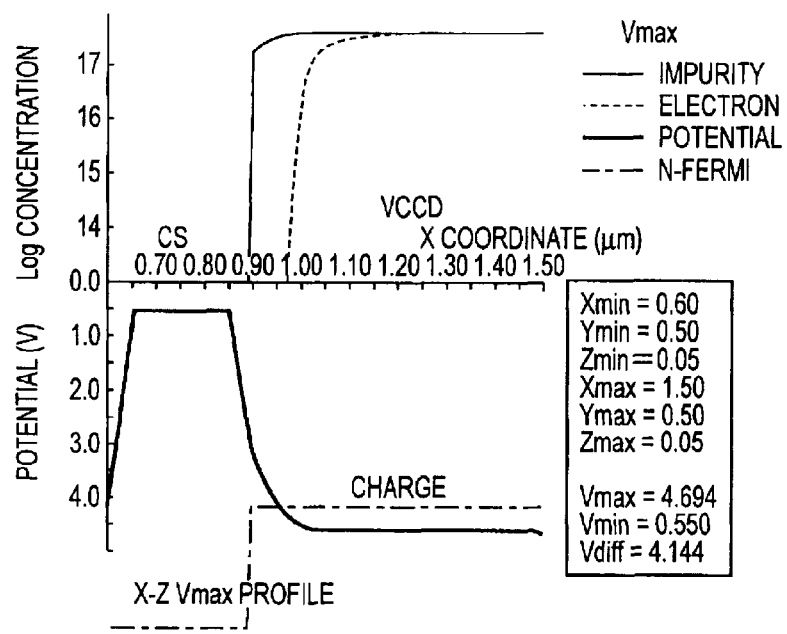
FIG. 7 is a chart showing a one-dimensional potential obtained when a charge is stored in a vertical transfer path of the solid-state image pick-up device illustrated in FIG. 2.

FIG. 4 is a chart showing a two-dimensional potential gradient in which -8V is applied to the electrode 17, and FIGS. 5 and 6 are charts showing a two-dimensional potential gradient and a one-dimensional potential which are obtained when a read voltage of +16V is applied to the electrode 17 respectively. Moreover, FIG. 7 is a chart showing a one-dimensional potential obtained when a charge is stored in the vertical transfer path.

In the case in which the charge is to be transferred through the vertical transfer path 12, 0V and -8V are alternately applied to the electrode 17. When a signal charge is to be read from a pixel (a light receiving sensor section) to the vertical transfer path 12, +16V is applied to the electrode 17. Consequently, a potential distribution around the channel stopper 13 is brought into any of states shown in FIGS. 3, 4 and 5.

As is apparent from FIGS. 3, 4, 5 and 6, a potential difference between the transfer path 12 and the channel stopper 13 is great and a potential is also low in the deep portion of the channel stopper 13. Therefore, the channel stopper 13 according to the embodiment produces a high isolation effect. Consequently, a charge mixture with the adjacent vertical transfer path can be prevented in charge reading, and furthermore, the charge trap into the interface 5 described with reference to FIG. 17 can also be prevented. Furthermore, there is no p-type impurity. Consequently, the narrow channel effect can also be relieved.

While the voltage to be applied to the polycrystalline silicon 15 is set to be 0V in the simulation, the same voltage is set to be negative so that the potential difference between the channel stopper 13 and the transfer path 12 is further increased and the charge mixture between the transfer paths 12 can be prevented still more.

In the solid-state image pick-up device 10 according to the embodiment, moreover, the polycrystalline silicon 15 having an almost equal coefficient of thermal expansion to that of the silicon substrate of the solid-state image pick-up device 10 is buried in the channel stopper 13 having a trench structure. Therefore, a stress received from the silicon substrate by the polycrystalline silicon 15 becomes very small so that the generation of a crystal defect due to the stress can be reduced.

Figure 8:
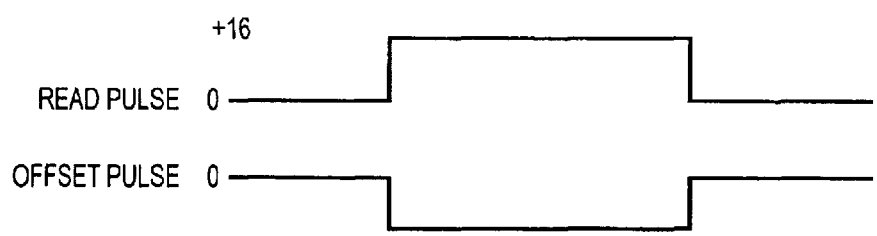
FIG. 8 is a diagram showing a charge read pulse and an offset pulse.

While the voltage to be applied to the polycrystalline silicon 15 is always set to be negative in the embodiment, it is preferable that an offset pulse having an opposite phase should be applied to the polycrystalline silicon 15 when a read voltage pulse of +16V is applied to the electrode 17 as shown in FIG. 8.

Figure 17:
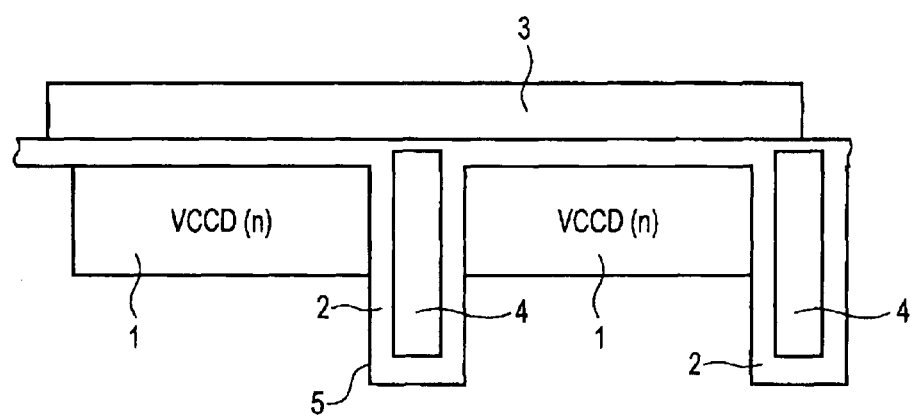
FIG. 17 is a sectional view showing the main part of another conventional solid-state image pick-up device.
Figure 18:
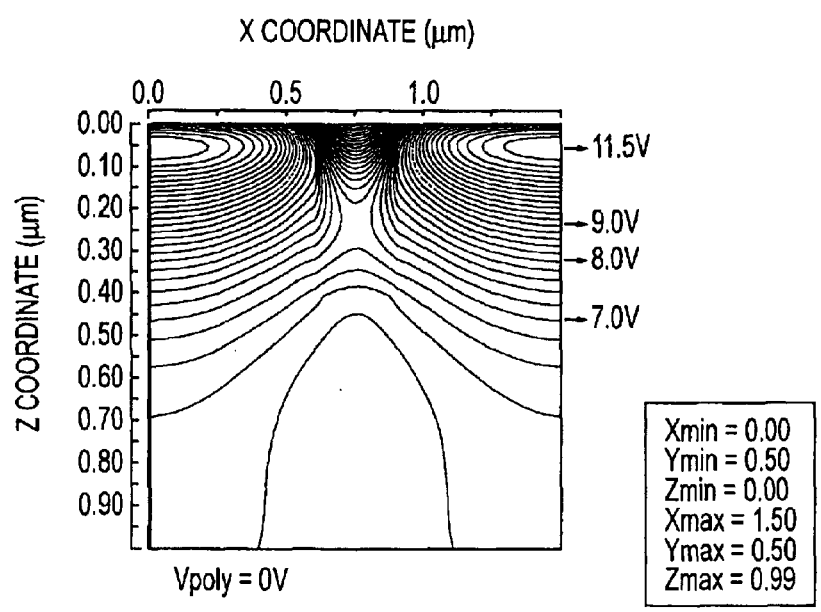
FIG. 18 is a chart showing a two-dimensional potential gradient around a channel stopper which is obtained when 0V is applied to an electrode illustrated in FIG. 17.
Figure 19:
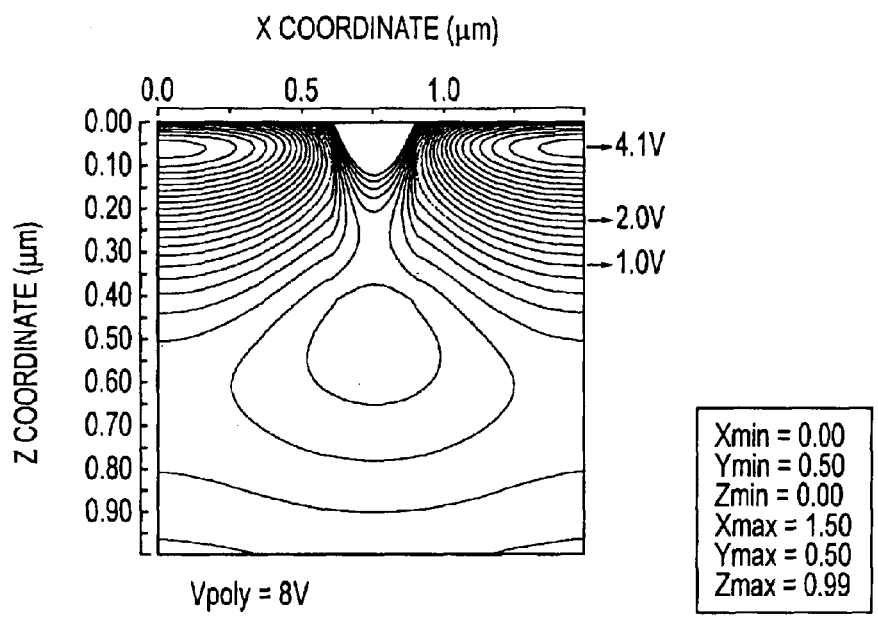
FIG. 19 is a chart showing a two-dimensional potential gradient around the channel stopper which is obtained when −8V is applied to the electrode illustrated in FIG. 17.
Figure 20:
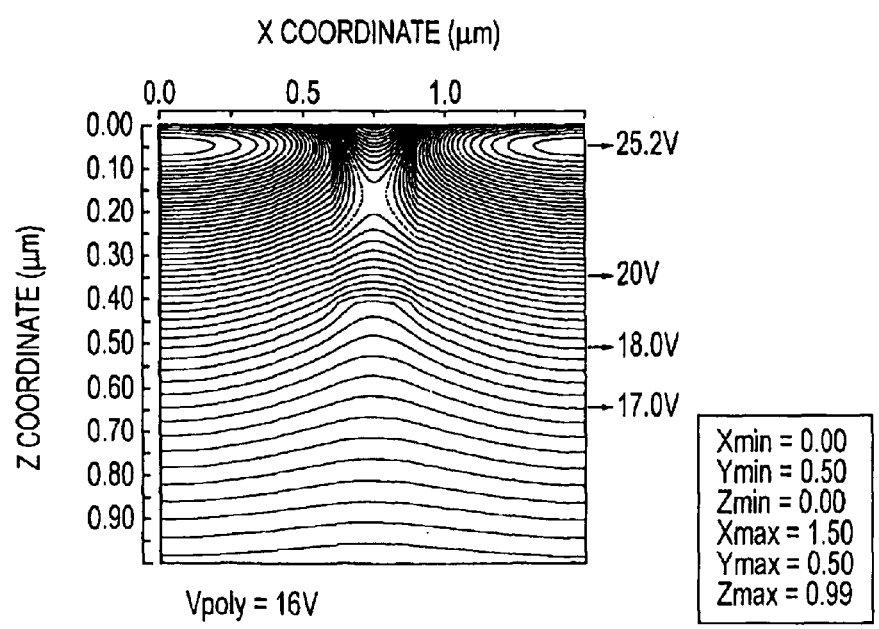
FIG. 20 is a chart showing a two-dimensional potential gradient around the channel stopper which is obtained when +16V is applied to the electrode illustrated in FIG. 17.
Figure 21:
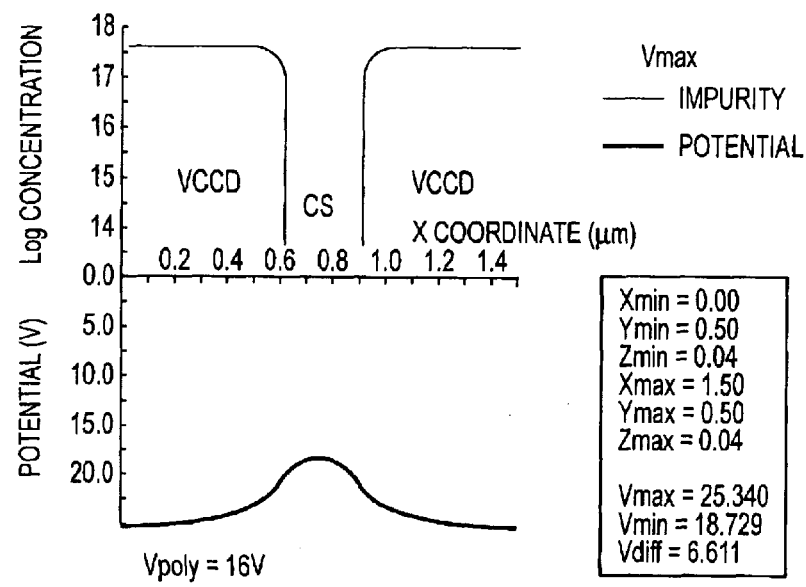
FIG. 21 is a chart showing a one-dimensional potential around the channel stopper which is obtained when +16V is applied to the electrode illustrated in FIG. 17.
Figure 22:
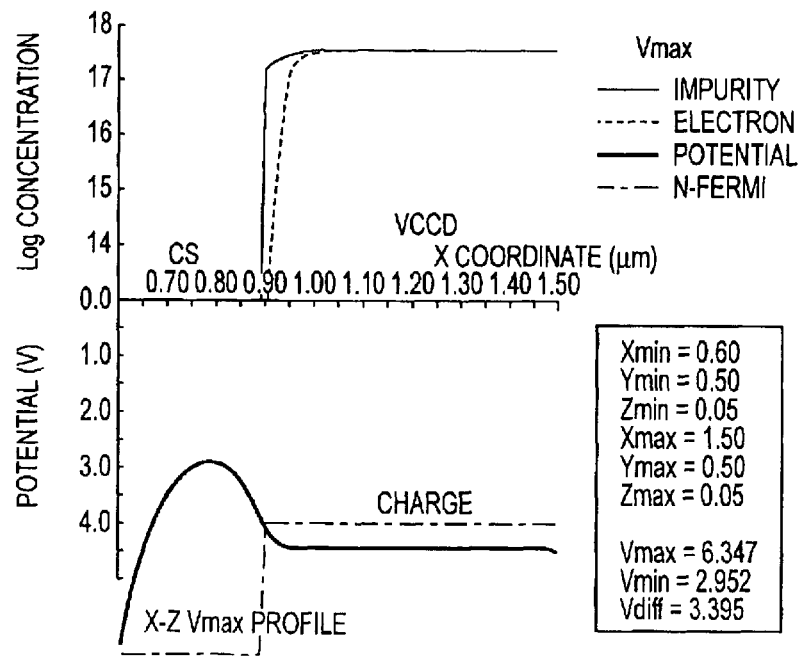
FIG. 22 is a chart showing a one-dimensional potential obtained when a charge is stored in a vertical transfer path of the solid-state image pick-up device illustrated in FIG. 17.

Consequently, the potential of the interface 5 described with reference to FIG. 17 is shifted to be negative so that the charge (electron) can further be prevented from being trapped into the interface 5. The start timing of the offset pulse is caused to slightly precede the start timing of a read potential pulse. The degree of precedence is calculated from a time constant determined by the resistance value of the polycrystalline silicon 15 described above.

Similarly, it is also possible to employ a structure in which an offset pulse having an opposite polarity to that of the transfer pulse is applied to the polycrystalline silicon 15 in response to a transfer pulse repeating "0V" and "-8V" to be applied to the electrode 17.

Figure 9:
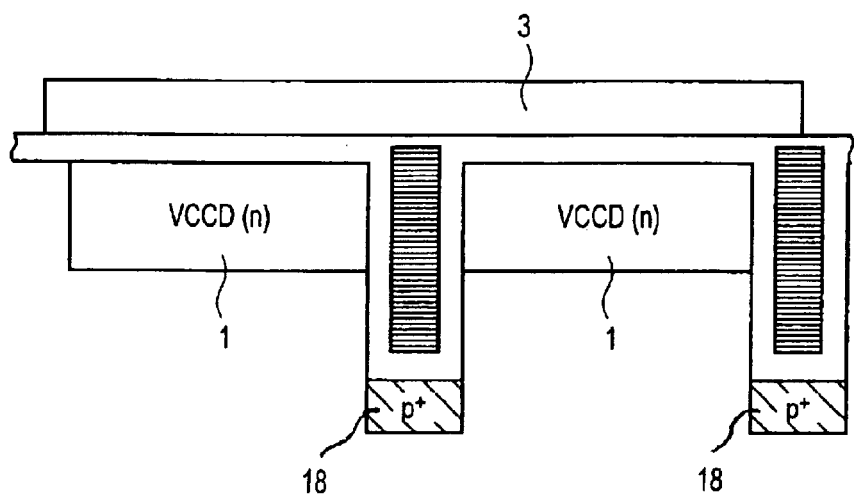
FIG. 9 is a sectional view showing the main part of a solid-state image pick-up device according to a second embodiment of the invention.
Figure 10:
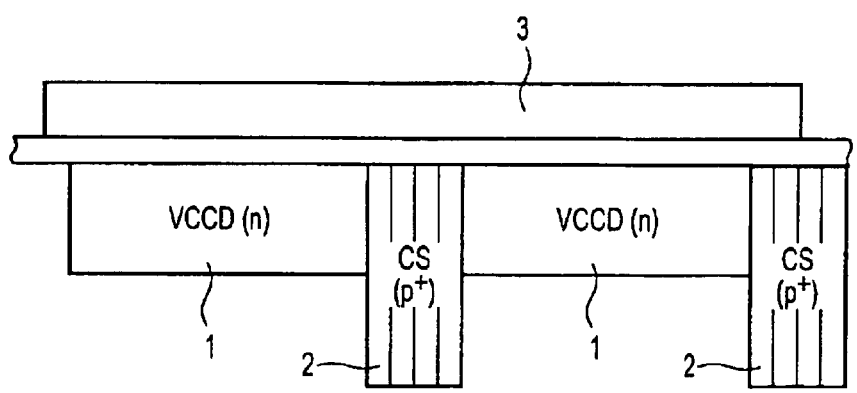
FIG. 10 is a sectional view showing the main part of a conventional solid-state image pick-up device.
Figure 11:
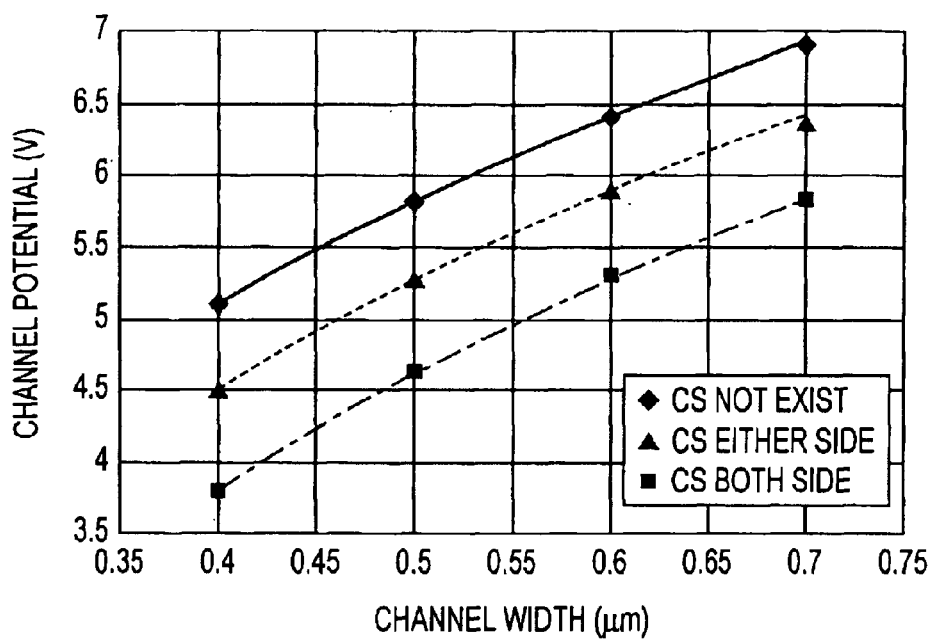
FIG. 11 is a graph for explaining a narrow channel effect, channel width dependence of channel potential in vertical transfer section by presence of isolation region [applied voltage=0V].
Figure 12:
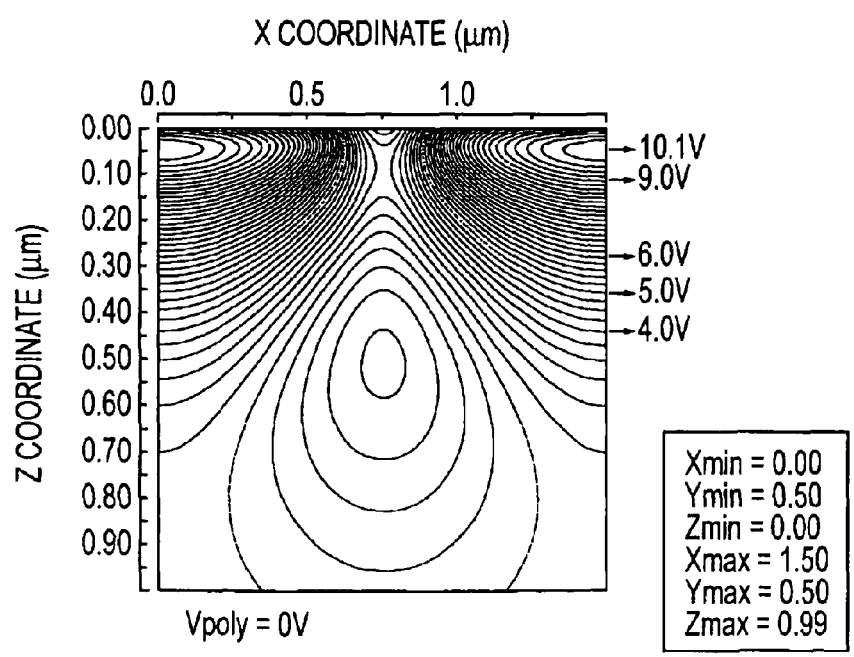
FIG. 12 is a chart showing a two-dimensional potential gradient around a channel stopper which is obtained when 0V is applied to an electrode illustrated in FIG. 10.
Figure 13:
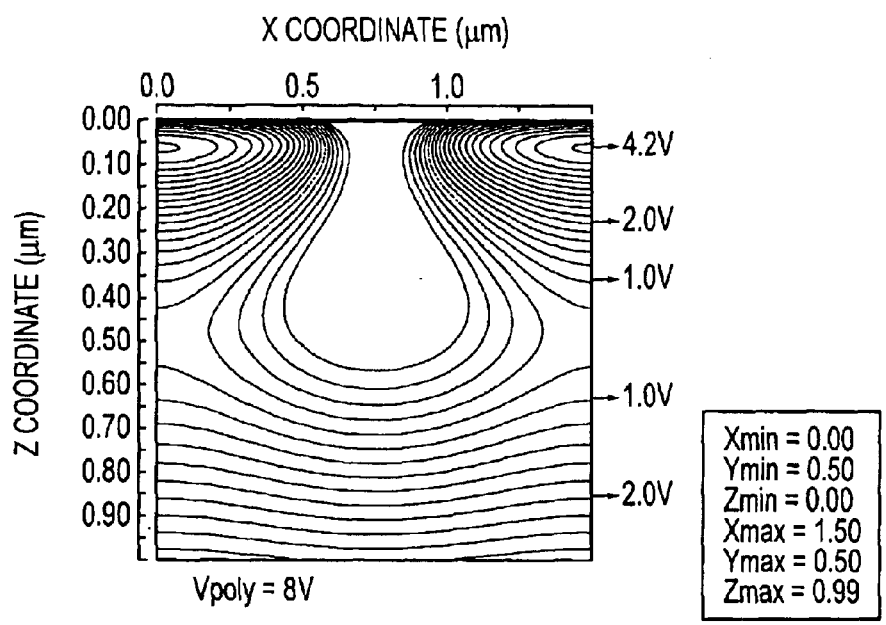
FIG. 13 is a chart showing a two-dimensional potential gradient around the channel stopper which is obtained when −8V is applied to the electrode illustrated in FIG. 10.
Figure 14:
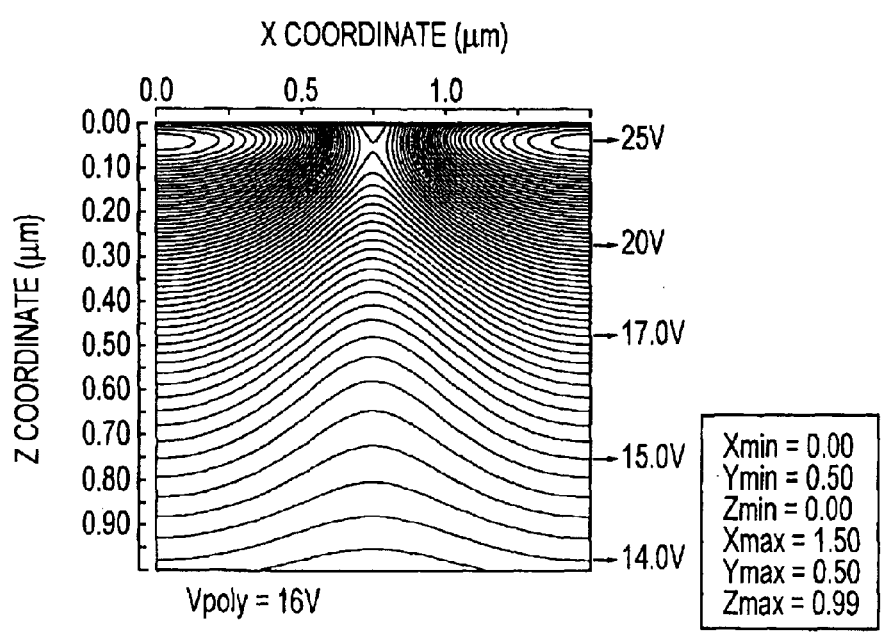
FIG. 14 is a chart showing a two-dimensional potential gradient around the channel stopper which is obtained when +16V is applied to the electrode illustrated in FIG. 10.
Figure 15:
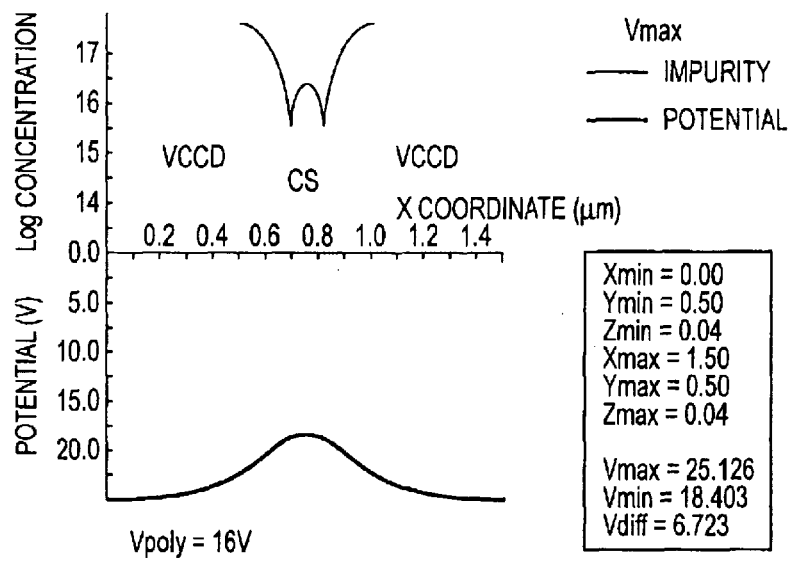
FIG. 15 is a chart showing a one-dimensional potential around the channel stopper which is obtained when +16V is applied to the electrode illustrated in FIG. 10.
Figure 16:
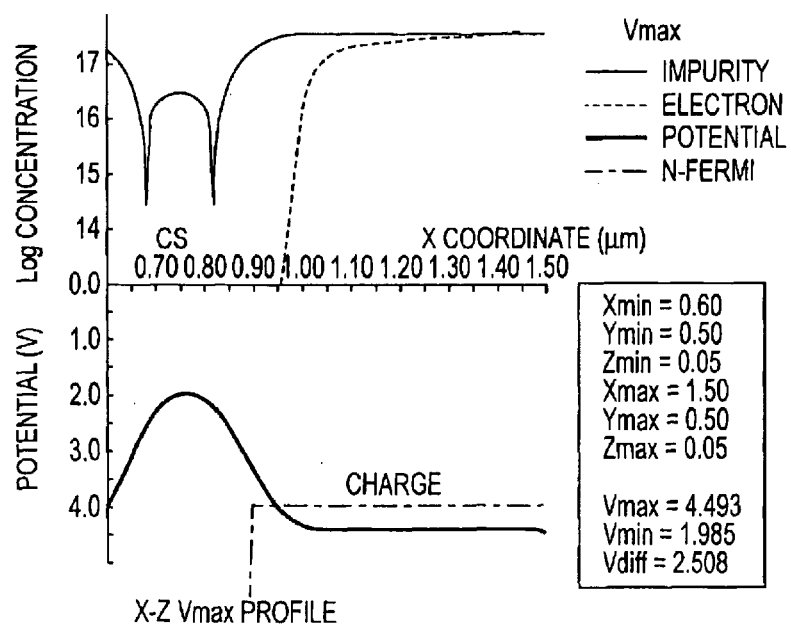
FIG. 16 is a chart showing a one-dimensional potential obtained when a charge is stored in a vertical transfer path of the solid-state image pick-up device illustrated in FIG. 10.

FIG. 9 is a sectional view showing the main part of a solid-state image pick-up device according to a second embodiment of the invention. The embodiment is different from the first embodiment in that a diffusion layer 18 is provided in the lower position of a channel stopper 13. The diffusion layer 18 is formed by diffusing an impurity having an opposite conductivity type to that of a pixel (a light receiving sensor section) 11, that is, a p-type impurity in an example shown in the drawing. Consequently, an isolation region reaches the deep portion of a substrate so that the mixture of a signal charge between the pixels 11 can be prevented still more.

Moreover, the p-type diffusion layer 18 is provided. Consequently, the channel stopper 13 according to the embodiment can be utilized as a path for sweeping a charge having an opposite polarity to that of the signal charge. It is suitable that a polycrystalline silicon 15 in the channel stopper 13 should also be doped with the p-type impurity having a high concentration to connect the polycrystalline silicon 15 to the p-type diffusion layer 18. Thus, the charge can be swept smoothly.

According to the invention, a conductive substance is buried in a channel stopper and the potential of the conductive substance is controlled to have a predetermined potential. Consequently, the isolation effect of the channel stopper can be enhanced and the narrow channel effect of a vertical transfer path can be relieved so that the generation of an image defect, a reduction in a transfer efficiency and an increase in a dark current can be prevented.

What is claimed is:

1. A solid-state image pick-up device comprising:
   a semiconductor substrate,
   a plurality of light receiving sensor sections on the semiconductor substrate,
   a plurality of vertical transfer path formed close to each of the light receiving sensor sections, and
   a channel stopper provided between the adjacent vertical transfer paths and formed by an insulating layer having a trench structure, wherein a conductive substance to which a predetermined voltage is applied is buried in the insulating layer and an oxide film is formed between the conductive substance and the adjacent vertical transfer paths.

2. A solid-state image pick-up device comprising:
   a semiconductor substrate,
   a plurality of light receiving sensor sections on the semiconductor substrate,
   a plurality of vertical transfer path formed close to each of the light receiving sensor sections, and a channel stopper provided between the adjacent vertical transfer paths and formed by an insulating layer having a trench structure, wherein a conductive substance to which a predetermined voltage is applied is buried in the insulating layer and an oxide film is formed between the conductive substance and the adjacent vertical transfer paths; wherein the predetermined voltage is a negative voltage if a signal charge is an electron, and is a positive voltage if the signal charge is a hole.

3. A solid-state image pick-up device comprising:

a semiconductor substrate, a plurality of light receiving sensor sections on the semiconductor substrate, a plurality of vertical transfer path formed close to each of the light receiving sensor sections, and a channel stopper provided between the adjacent vertical transfer paths and formed by an insulating layer having a trench structure, wherein a conductive substance to which a predetermined voltage is applied is buried in the insulating layer and an oxide film is formed between the conductive substance and the adjacent vertical transfer paths; wherein the predetermined voltage is a pulse having an opposite phase to that of a read pulse to be applied to a transfer electrode of the vertical transfer path.

4. A solid-state image pick-up device comprising:

a semiconductor substrate, a plurality of light receiving sensor sections on the semiconductor substrate, a plurality of vertical transfer path formed close to each of the light receiving sensor sections, and a channel stopper provided between the adjacent vertical transfer paths and formed by an insulating layer having a trench structure, wherein a conductive substance to which a predetermined voltage is applied is buried in the insulating layer and an oxide film is formed between the conductive substance and the adjacent vertical transfer paths; wherein a diffusion region having an opposite conductivity type to that of the light receiving sensor section is formed in a lowermost part of the channel stopper.

5. The solid-state image pick-up device according to claim 4, wherein the conductive substance is also doped with a doped impurity in the diffusion region, and the conductive substance and the diffusion region are thus set in a connecting state.

6. The solid-state image pick-up device according to claim 1, wherein the conductive substance is a polycrystalline silicon.

7. The solid-state image pick-up device according to claim 3, wherein the conductive substance is a polycrystalline silicon.

8. The solid-state image pick-up device according to claim 4, wherein the conductive substance is a polycrystalline silicon.

9. The solid-state image pick-up device according to claim 5, wherein the conductive substance is a polycrystalline silicon.

10. A solid-state image pick-up device comprising:

a semiconductor substrate, a plurality of light receiving sensor sections on the semiconductor substrate, a plurality of vertical transfer path formed close to each of the light receiving sensor sections, and a channel stopper provided between the adjacent vertical transfer paths and formed by an insulating layer having a trench structure, wherein a conductive substance to which a predetermined voltage is applied is buried in the insulating layer and an oxide film is formed between the conductive substance and the adjacent vertical transfer paths; wherein a coefficient of thermal expansion of the conductive substance is approximately equal to a coefficient of thermal expansion of a silicon substrate forming said semiconductor substrate.

11. The solid-state image pick-up device according to claim 10, wherein said conductive substance is a polycrystalline silicon.

12. The solid-state image pick-up device according to claim 2, wherein the conductive substance is a polycrystalline silicon.

* * * * *

UNITED STATES PATENT AND TRADEMARK OFFICE
CERTIFICATE OF CORRECTION

PATENT NO. : 6,891,243 B2  Page 1 of 1
DATED : May 10, 2005
INVENTOR(S) : Yuko Adachi et al.

It is certified that error appears in the above-identified patent and that said Letters Patent is hereby corrected as shown below:

Title page,
Item [73], Assignee, should read:
-- Fuji Photo Film Co., Ltd., Ashigara (JP) --.

Signed and Sealed this

Twentieth Day of December, 2005

JON W. DUDAS
*Director of the United States Patent and Trademark Office*